(12) United States Patent
Wang et al.

(10) Patent No.: US 11,676,838 B2
(45) Date of Patent: Jun. 13, 2023

(54) WAFER CASSETTE

(71) Applicant: VisEra Technologies Company Limited, Hsin-Chu (TW)

(72) Inventors: Chao-Chih Wang, Hsinchu (TW); Ya-Nan Wang, Taoyuan (TW); Chia-He Wu, Taoyuan (TW); Cheng-Han Chiang, Jincheng Township, Kinmen County (TW)

(73) Assignee: VISERA TECHNOLOGIES COMPANY LIMIIED, Hsin-Chu (TW)

( * ) Notice: Subject to any disclaimer, the term of this patent is extended or adjusted under 35 U.S.C. 154(b) by 169 days.

(21) Appl. No.: 17/186,980

(22) Filed: Feb. 26, 2021

(65) Prior Publication Data

US 2022/0277967 A1    Sep. 1, 2022

(51) Int. Cl.
*H01L 21/673* (2006.01)
*H01L 21/32* (2006.01)

(52) U.S. Cl.
CPC ................................. *H01L 21/32* (2013.01)

(58) Field of Classification Search
CPC ........... H01L 21/6732; H01L 21/37303; H01L 21/67359; H01L 21/6735; H01L 21/373; B65D 25/103
USPC ........................................ 206/710, 712, 711
See application file for complete search history.

(56) References Cited

U.S. PATENT DOCUMENTS

| | | | | |
|---|---|---|---|---|
| 2013/0299384 A1* | 11/2013 | Fuller | ............... | H01L 21/67369 53/485 |
| 2014/0367307 A1* | 12/2014 | Oyama | ............. | H01L 21/67383 206/711 |
| 2015/0083639 A1* | 3/2015 | Gregerson | ........ | H01L 21/67369 206/711 |

FOREIGN PATENT DOCUMENTS

| | | |
|---|---|---|
| JP | H11-233595 A | 8/1999 |
| KR | 10-2015-0023941 A | 3/2015 |

OTHER PUBLICATIONS

Office Action dated Sep. 27, 2022 issued in corresponding Korea Application No. 10-2021-0066444 (with its English translation).

* cited by examiner

*Primary Examiner* — King M Chu
(74) *Attorney, Agent, or Firm* — Muncy, Geissler, Olds & Lowe, P.C.

(57) ABSTRACT

A wafer cassette for receiving a wafer is provided. The wafer cassette includes a cassette housing, a first supporting rib and a second supporting rib. The first supporting rib is disposed in the cassette housing, wherein the first supporting rib includes a front supporting portion, a middle supporting portion and a rear supporting portion, the front supporting portion is connected to one end of the middle supporting portion, the rear supporting portion is connected to the other end of the middle supporting portion, and the front supporting portion has a front curved edge. The second supporting rib is disposed in the cassette housing. An edge portion of the wafer is supported by the first supporting rib and the second supporting rib, and the front supporting portion, the middle supporting portion and the rear supporting portion contact the wafer simultaneously.

8 Claims, 7 Drawing Sheets

WAFER CASSETTE

BACKGROUND OF THE INVENTION

Field of the Invention

The present invention relates to a wafer cassette, and in particular to a wafer cassette with improved supporting ability.

Description of the Related Art

Conventionally, the wafer cassette has a plurality of supporting ribs for supporting wafers. The supporting ribs contact the contacting area on the edge of the wafer. To prevent the supporting ribs from damaging the dies of the wafer and to increase available process area of the wafer, the contacting area must be decreased. However, the thickness of the wafer is reduced in the future. FIG. 7 shows the wafer W supported by the supporting ribs 91 of the conventional wafer cassette 9. With reference to FIG. 7, since the thickness of the wafer is reduced, the central portion of the wafer is deformed downwardly due to gravity. When the fork picks the wafer from the wafer cassette, the fork may collide with the wafer and damage the wafer.

Conventionally, to prevent the central portion of the wafer from being deformed downwardly, a tongue-shaped plate is provided to support the wafer. The tongue shaped plate supports the central portion of the wafer. However, as to the double-side die-arranged wafer, the tongue-shaped plate may damage the dies on the bottom of the wafer.

BRIEF SUMMARY OF THE INVENTION

Embodiments of the invention are provided to address the aforementioned difficulty.

In one embodiment, a wafer cassette for receiving a wafer is provided. The wafer cassette includes a cassette housing, a first supporting rib and a second supporting rib. The cassette housing includes a front opening, wherein the wafer enters the cassette housing via the front opening. The first supporting rib is disposed in the cassette housing. The second supporting rib is disposed in the cassette housing, wherein the wafer is supported by the first supporting rib and the second supporting rib, the first supporting rib contacts a first contact area of the wafer, and the second supporting rib contacts a second contact area of the wafer. Relative to the center of the circle of the wafer, the angular range of the first contact area is between 80° and 110°, and the angular range of the second contact area is between 80° and 110°.

In one embodiment, the first contact area has a contact area width, and the contact area width is between 3% and 8% of the radius of the wafer.

In one embodiment, the first supporting rib comprises a first supporting surface, an included angle is formed between the first supporting surface and a horizontal plane, and the included angle is between 0.5° and 4°.

In one embodiment, the first contact area has a front contact section and a rear contact section, the front contact section corresponds to the front opening, the front contact section is connected to the rear contact section, wherein relative to the center of circle of the wafer, an angular range of the front contact section is between 25° and 55°, and an angular range of the rear contact section is between 50° and 55°.

In one embodiment, the front contact section has a front contact area width, and the front contact area width is 3%~5% of the radius of the wafer, and the rear contact section has a rear contact area width, and the rear contact area width is 5%~8% of the radius of the wafer.

In another embodiment, a wafer cassette for receiving a wafer is provided. The wafer cassette includes a cassette housing, a first supporting rib and a second supporting rib. The cassette housing includes a front opening, wherein the wafer enters the cassette housing via the front opening. The first supporting rib is disposed in the cassette housing, wherein the first supporting rib comprises a front supporting portion, a middle supporting portion and a rear supporting portion, the front supporting portion corresponds to the front opening, the front supporting portion is connected to one end of the middle supporting portion, the rear supporting portion is connected to the other end of the middle supporting portion, and the front supporting portion has a front curved edge. The second supporting rib is disposed in the cassette housing. The wafer is supported by the first supporting rib and the second supporting rib, and the front supporting portion, the middle supporting portion and the rear supporting portion contact the wafer simultaneously.

In one embodiment, the middle supporting portion has a straight edge, and the rear supporting portion has a rear curved edge.

In one embodiment, a rib notch is formed on the front supporting portion.

Utilizing the wafer cassette of the embodiment of the invention, the first supporting ribs and the second supporting ribs only support the edge portion of wafer rather than contact the central portion of the wafer. As to the double-side die-arranged wafer, the dies on the bottom of the wafer are protected from being damaged. In one embodiment, relative to the center of circle of the wafer, the angular range of the first contact area is between 80° and 110°, and an angular range of the second contact area is between 80° and 110°. Therefore, the wafer is sufficiently supported by the first supporting rib and the second supporting rib, and the central portion of the wafer is prevented from being deformed downwardly. In another embodiment, the first supporting rib comprises the front supporting portion, the middle supporting portion and the rear supporting portion, and the front supporting portion has the front curved edge. The front supporting portion provides additional support for the wafer, and the central portion of the wafer is prevented from being deformed downwardly.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
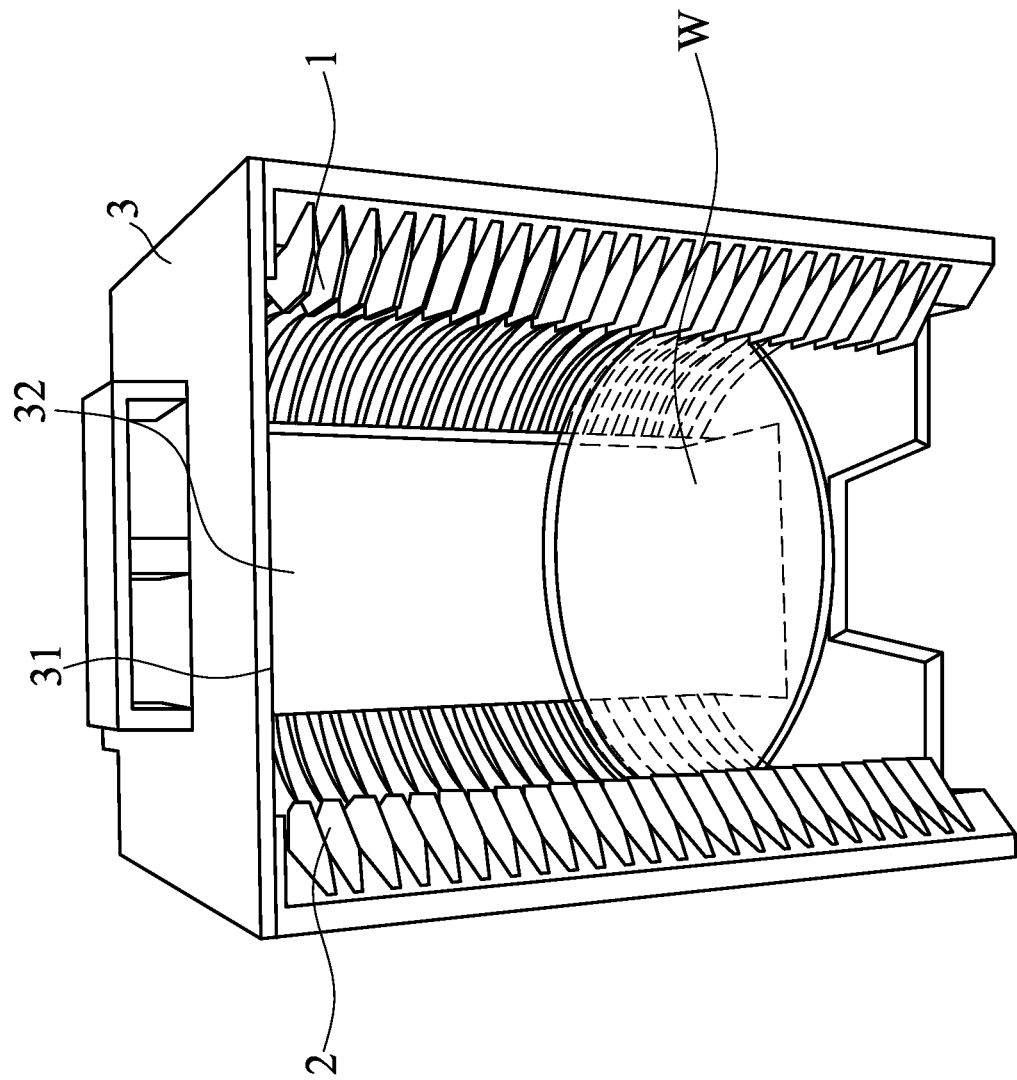
FIG. 1 shows a wafer cassette of an embodiment of the invention.

FIG. 1 shows a wafer cassette of an embodiment of the invention. As shown in FIG. 1, the wafer cassette B of the embodiment of the invention is utilized for receiving a plurality of wafers W. The wafer cassette B includes a cassette housing 3, a plurality of first supporting ribs 1 and a plurality of second supporting ribs 2. The cassette housing 3 includes a front opening 31, wherein the wafer W enters the cassette housing 3 via the front opening 31. The first supporting ribs 1 are disposed in the cassette housing 3. Particularly, the first supporting ribs 1 are formed on a first inner wall of the cassette housing 3. The second supporting ribs 2 are disposed in the cassette housing 3. Particularly, the second supporting ribs 2 are formed on a second inner wall of the cassette housing 3. The first inner wall faces to the second inner wall. The wafer W is supported by the first supporting rib 1 and the second supporting rib 2.

Figure 2:
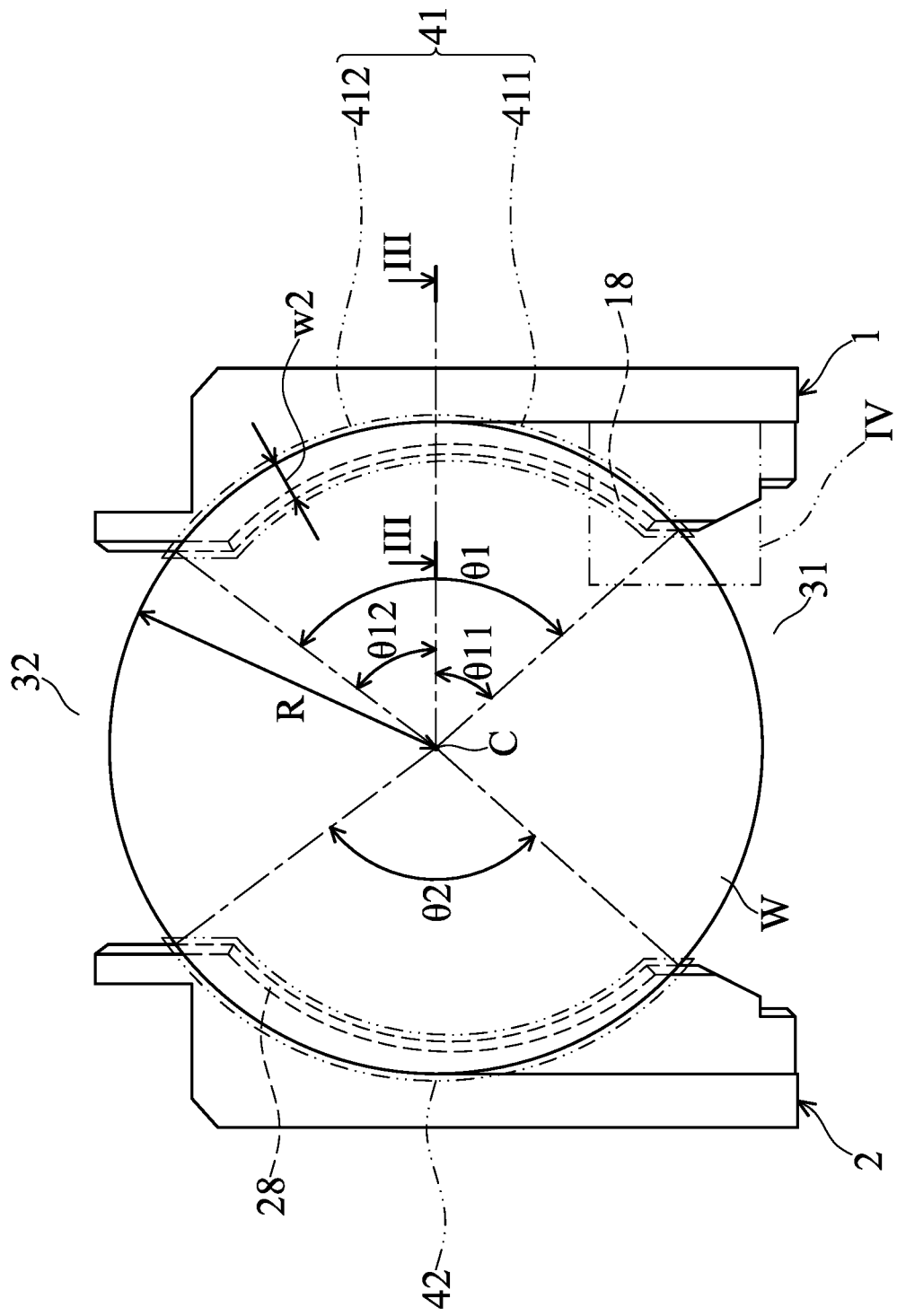
FIG. 2 shows a wafer cassette of a first embodiment of the invention.

FIG. 2 shows a wafer cassette of a first embodiment of the invention. With reference to FIG. 2, in the first embodiment, the edge 18 of the first supporting rib 1 of the wafer cassette B1 is curved, and the edge 28 of the second supporting rib 2 of the wafer cassette B1 is curved. the first supporting rib 1 contacts a first contact area 41 of the wafer W, and the second supporting rib 2 contacts a second contact area 42 of the wafer W. Relative to the center C of the circle of the wafer W, the angular range θ1 of the first contact area 41 is between 80° and 110°, and the angular range θ2 of the second contact area 42 is between 80° and 110°. In one embodiment, the angular range θ1 of the first contact area 41 is 98°, and the angular range θ2 of the second contact area 42 is 98°.

Figure 3:
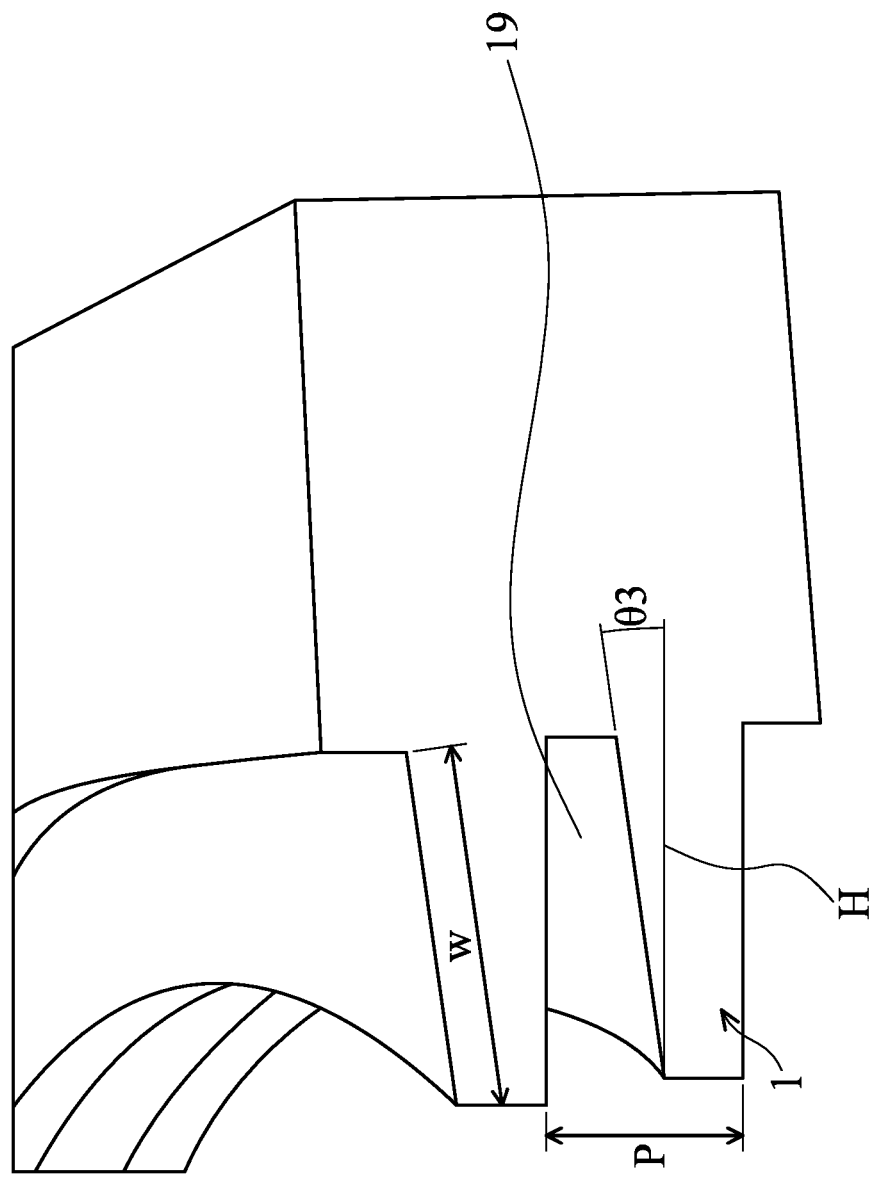
FIG. 3 is a cross sectional view along the direction of FIG. 2.

FIG. 3 is a cross sectional view along the direction III-III of FIG. 2. With reference to FIGS. 2 and 3, in one embodiment, the first contact area 41 has a contact area width w, and the contact area width w is between 3% and 8% of a radius R of the wafer W.

With reference to FIG. 3, in one embodiment, the first supporting rib 1 comprises a first supporting surface 19. An included angle θ3 is formed between the first supporting surface 19 and a horizontal plane H, and the included angle θ3 is between 0.5° and 4°. In one embodiment, the included angle θ3 is between 1° and 2°. The included angle θ3 between the first supporting surface 19 and the horizontal plane H increases the contact area between the first supporting surface 19 and the wafer W, which prevents stress concentration and protects the wafer from being damaged.

With reference to FIG. 2, in one embodiment, the first contact area 41 has a front contact section 411 and a rear contact section 412. The front contact section 411 corresponds to the front opening 31. The front contact section 411 is connected to the rear contact section 412. Relative to the center C of circle of the wafer W, an angular range θ11 of the front contact section 411 is between 25° and 55°, and an angular range θ12 of the rear contact section 412 is between 50° and 55°. In one embodiment, the angular range θ11 of the front contact section 411 is 55°, and the angular range θ12 of the rear contact section 412 is 43°.

Figure 4:
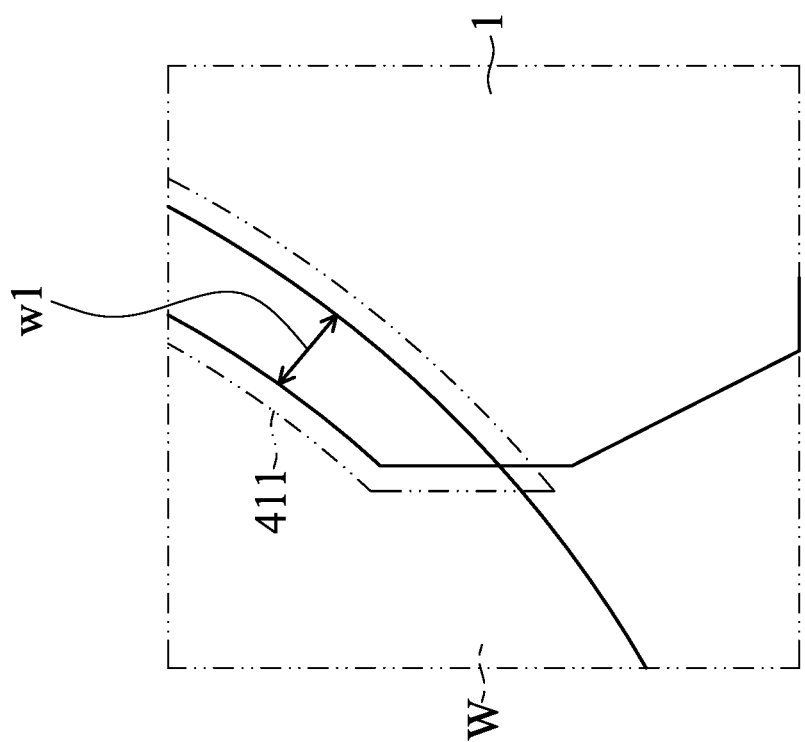
FIG. 4 is an enlarged view of portion IV of FIG. 2.

FIG. 4 is an enlarged view of portion IV of FIG. 2. With reference to FIGS. 2, 3 and 4, in one embodiment, the front contact section 411 has a front contact area width w1, and the front contact area width w1 is 3%~5% of the radius R of the wafer W, and the rear contact section 412 has a rear contact area width w2, and the rear contact area width w2 is 5%~8% of the radius R of the wafer W. In one embodiment, the front contact area width w1 is at less 3% of the radius R of the wafer W, and the rear contact area width w2 is 7.5% of the radius R of the wafer W.

With reference to FIG. 3, in one embodiment, the pitch P between the two first supporting ribs is 6.35 mm.

With reference to FIGS. 1 and 2, in one embodiment, the cassette housing 3 includes a rear opening 32. The rear opening 32 is opposite to the front opening 31.

Figure 5:
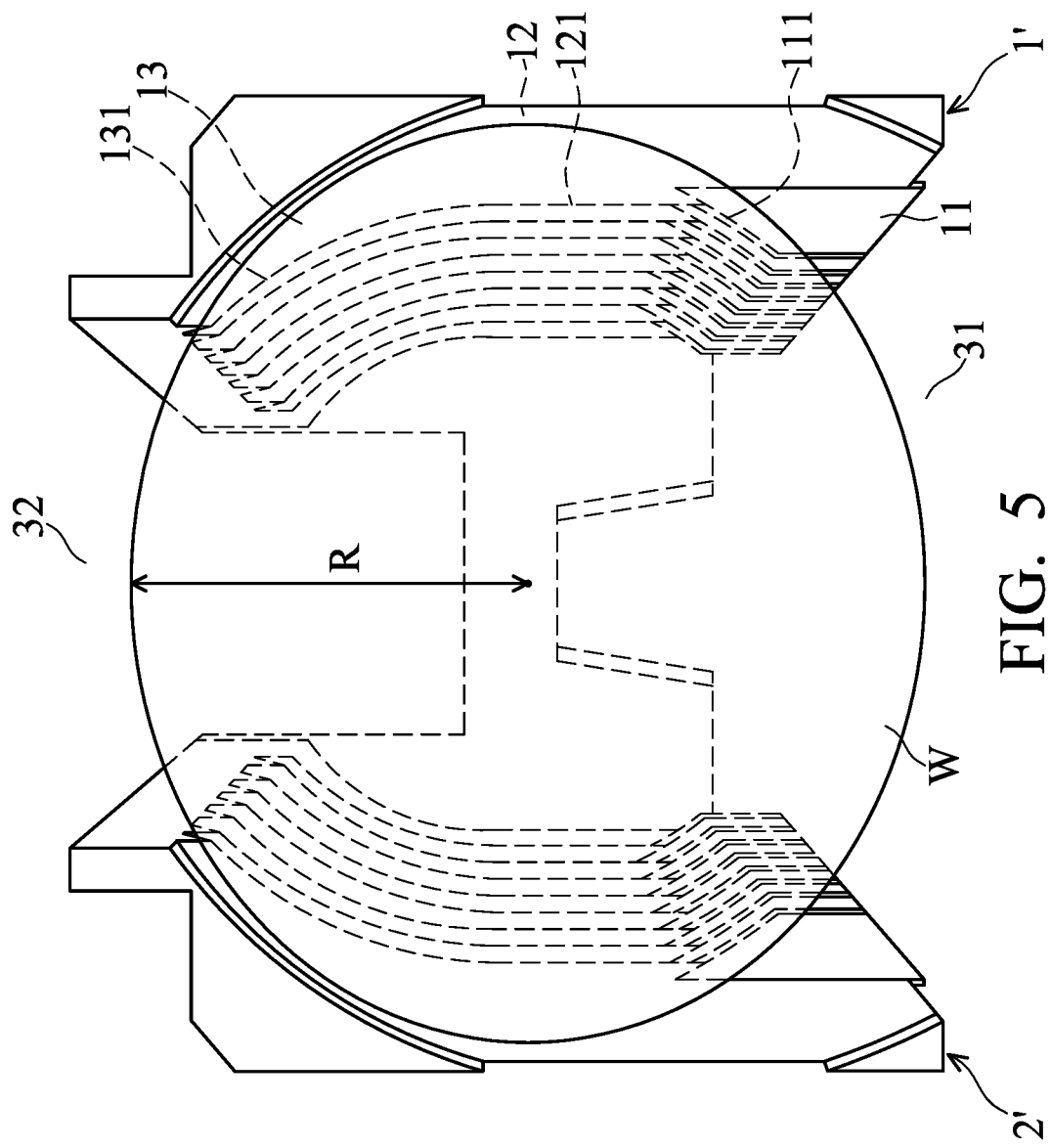
FIG. 5 shows a wafer cassette of a second embodiment of the invention.

FIG. 5 shows a wafer cassette of a second embodiment of the invention. With reference to FIG. 5, similar to the first embodiment, the wafer cassette B2 includes a cassette housing, a first supporting rib 1' and a second supporting rib 2'. The cassette housing includes a front opening 31, wherein the wafer W enters the cassette housing via the front opening 31. The first supporting rib 1' is disposed in the cassette housing, wherein the first supporting rib 1' comprises a front supporting portion 11, a middle supporting portion 12 and a rear supporting portion 13. The front supporting portion 11 corresponds to the front opening 31. The front supporting portion 11 is connected to one end of the middle supporting portion 12. The rear supporting portion 13 is connected to the other end of the middle supporting portion 12. The middle supporting portion 12 has a straight edge 121, and the front supporting portion 11 has a front curved edge 111. The second supporting rib 2' is disposed in the cassette housing. The wafer W is supported by the first supporting rib 1' and the second supporting rib 2'. The front supporting portion 11, the middle supporting portion 12 and the rear supporting portion 13 contact the wafer W simultaneously.

With reference to FIG. 5, in one embodiment, the rear supporting portion 13 has a rear curved edge 131.

Figure 6:
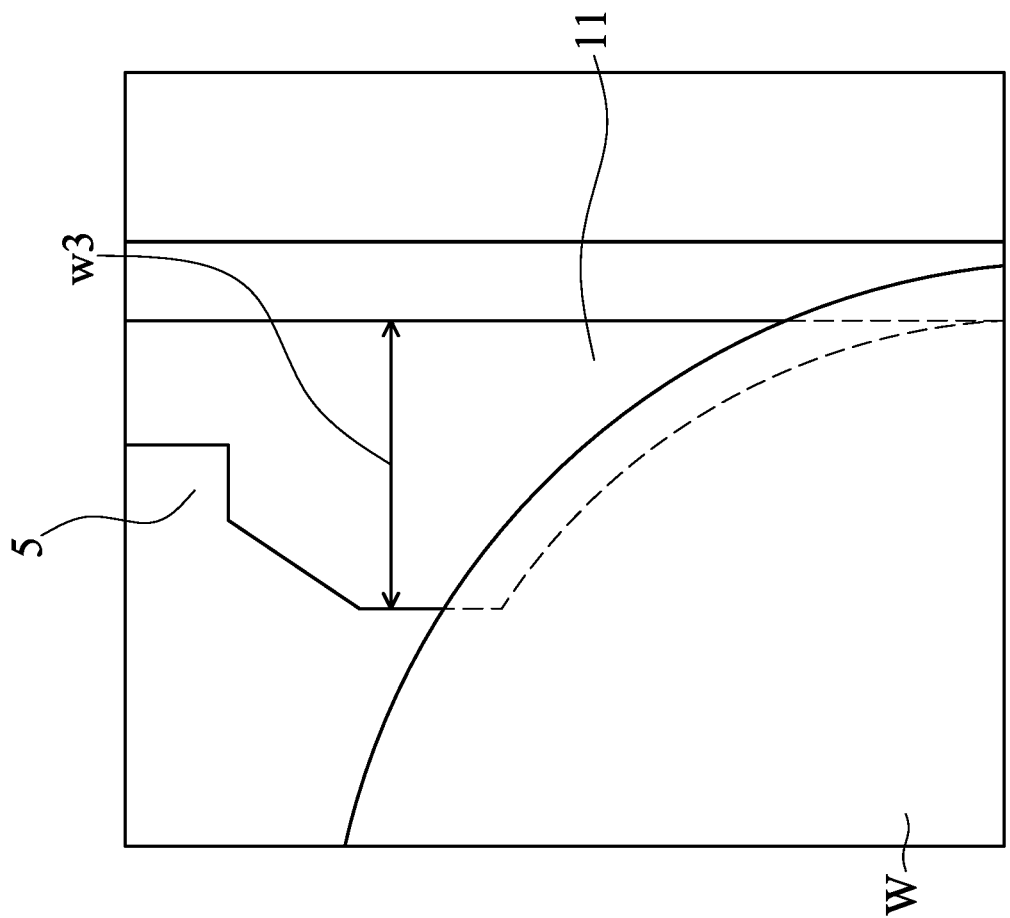
FIG. 6 is a modified example of the wafer cassette of the second embodiment.
Figure 7:
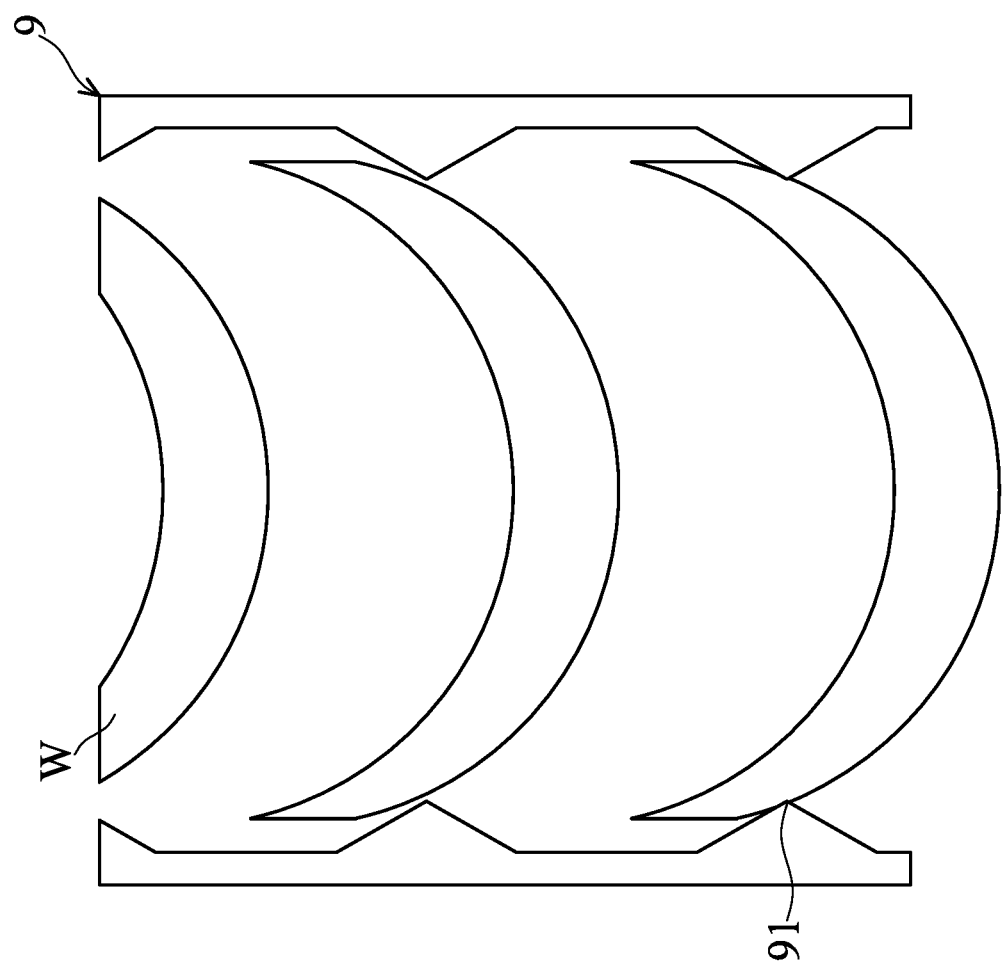
FIG. 7 shows the wafer supported by the supporting ribs of the conventional wafer cassette.

FIG. 6 is a modified example of the wafer cassette of the second embodiment. With reference to FIG. 6, in one embodiment, a rib notch 5 is formed on the front supporting portion 11. The rib notch 5 is for the sensing of a wafer sensor.

With reference to FIGS. 5 and 6, in one embodiment, the front supporting portion 11 has a portion width w3. The portion width w3 is about 10%~40% of the radius R of the wafer W. In one embodiment, the portion width w3 is 20% of the radius R of the wafer W.

In one embodiment, a fork is provided to transform the wafers. The fork can in inserted in to the wafer cassette through the front opening 31. The fork can be a planar-type fork or a tooth-type fork.

In one embodiment, there is no additional supporting structure formed between the first supporting rib and the second supporting rib, since the first supporting rib and the second supporting rib already provide sufficient support toward the wafer. In other words, there is no additional supporting structure which supports the central portion of the wafer.

In one embodiment, the size of the wafer can be equal to or lower than 12-inches.

Utilizing the wafer cassette of the embodiment of the invention, the first supporting ribs and the second supporting ribs only support the edge portion of wafer rather than contact the central portion of the wafer. As to the double-side die-arranged wafer, the dies on the bottom of the wafer are protected from being damaged. In one embodiment, relative to the center of circle of the wafer, the angular range of the first contact area is between 80° and 110°, and an angular range of the second contact area is between 80° and 110°. Therefore, the wafer is sufficiently supported by the first supporting rib and the second supporting rib, and the central portion of the wafer is prevented from being deformed downwardly. In another embodiment, the first supporting rib comprises the front supporting portion, the middle supporting portion and the rear supporting portion, and the front supporting portion has the front curved edge. The front supporting portion provides additional support for the wafer, and the central portion of the wafer is prevented from being deformed downwardly.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A wafer cassette, for receiving a wafer, comprising:
a cassette housing, comprising a front opening, wherein the wafer enters the cassette housing via the front opening;
a first supporting rib, disposed in the cassette housing; and
a second supporting rib, disposed in the cassette housing, wherein the wafer is supported by the first supporting rib and the second supporting rib, the first supporting rib contacts a first contact area of the wafer, and the second supporting rib contacts a second contact area of the wafer,
wherein relative to a center of a circle of the wafer, an angular range of the first contact area is between 80° and 110°, and an angular range of the second contact area is between 80° and 110°,
wherein the first contact area has a front contact section and a rear contact section, the front contact section corresponds to the front opening, the front contact section is connected to the rear contact section, wherein relative to the center of the circle of the wafer, an angular range of the front contact section is between 25° and 55°, and an angular range of the rear contact section is between 50° and 55°.

2. The wafer cassette as claimed in claim 1, wherein the first contact area has a contact area width, and the contact area width is between 3% and 8% of a radius of the wafer.

3. The wafer cassette as claimed in claim 1, wherein the first supporting rib comprises a first supporting surface, an included angle is formed between the first supporting surface and a horizontal plane, and the included angle is between 0.5° and 4°.

4. The wafer cassette as claimed in claim 1, wherein the front contact section has a front contact area width, and the front contact area width is 3%~5% of the radius of the wafer, and the rear contact section has a rear contact area width, and the rear contact area width is 5%~8% of the radius of the wafer.

5. A wafer cassette, for receiving a wafer, comprising:
a cassette housing, comprising a front opening, wherein the wafer enters the cassette housing via the front opening;
a first supporting rib, disposed in the cassette housing, wherein the first supporting rib comprises a front supporting portion, a middle supporting portion and a rear supporting portion, the front supporting portion corresponds to the front opening, the front supporting portion is connected to one end of the middle supporting portion, the rear supporting portion is connected to the other end of the middle supporting portion, and the front supporting portion has a front curved edge; and
a second supporting rib, disposed in the cassette housing, wherein the wafer is supported by the first supporting rib and the second supporting rib, and the front supporting portion, the middle supporting portion and the rear supporting portion contact the wafer simultaneously,
wherein the middle supporting portion has a straight edge, and the rear supporting portion has a rear curved edge.

6. The wafer cassette as claimed in claim 5, wherein the first supporting rib comprises a first supporting surface, an included angle is formed between the first supporting surface and a horizontal plane, and the included angle is between 0.5° and 4°.

7. The wafer cassette as claimed in claim 5, wherein the front supporting portion contacts the wafer with a front contact section, the rear supporting portion contacts the wafer with a rear contact section, the front contact section has a front contact area width, and the front contact area width is 3%~5% of the radius of the wafer, and the rear contact section has a rear contact area width, and the rear contact area width is 5%~8% of the radius of the wafer.

8. The wafer cassette as claimed in claim 5, wherein a rib notch is formed on the front supporting portion.

* * * * *